US006611419B1

United States Patent
Chakravorty (10) Patent No.: US 6,611,419 B1
(45) Date of Patent: Aug. 26, 2003

(54) ELECTRONIC ASSEMBLY COMPRISING SUBSTRATE WITH EMBEDDED CAPACITORS

(75) Inventor: Kishore K. Chakravorty, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/631,037

(22) Filed: Jul. 31, 2000

(51) Int. Cl.[7] .............................................. H01G 4/228
(52) U.S. Cl. .................... 361/306.3; 361/311; 361/313; 361/306.1; 361/309
(58) Field of Search ............................ 361/306.3, 313, 361/763, 219, 321.2, 306.1, 312, 320, 738, 309, 307, 308.3, 329, 330

(56) References Cited

U.S. PATENT DOCUMENTS

| | | | |
|---|---|---|---|
| 4,926,241 A | 5/1990 | Carey ........................ | 357/75 |
| 5,060,116 A | 10/1991 | Grobman et al. ........... | 361/474 |
| 5,177,594 A | 1/1993 | Chance et al. .............. | 257/678 |
| 5,177,670 A | 1/1993 | Shinohara et al. .......... | 361/388 |
| 5,281,151 A | 1/1994 | Arima et al. ................ | 439/68 |
| 5,354,955 A | 10/1994 | Gregor et al. .............. | 174/250 |
| 5,377,139 A | 12/1994 | Lage et al. ................. | 365/154 |
| 5,469,324 A | 11/1995 | Henderson et al. ....... | 361/301.2 |
| 5,488,542 A * | 1/1996 | Ito ............................. | 361/793 |
| 5,639,989 A | 6/1997 | Higgins, III ............ | 174/35 MS |
| 5,691,568 A | 11/1997 | Chou et al. ................. | 257/691 |
| 5,714,801 A * | 2/1998 | Yano et al. ................. | 257/691 |
| 5,745,335 A | 4/1998 | Watt ........................... | 361/313 |
| 5,796,587 A | 8/1998 | Lauffer et al. ............. | 361/763 |
| 5,818,699 A | 10/1998 | Fukuoka ..................... | 361/760 |
| 5,840,382 A | 11/1998 | Nishide et al. ............. | 428/209 |
| 5,870,274 A | 2/1999 | Lucas ......................... | 361/311 |

(List continued on next page.)

FOREIGN PATENT DOCUMENTS

| | | | |
|---|---|---|---|
| EP | 0359513 | 3/1990 | ........... H01L/23/64 |
| JP | 07-142867 | 6/1995 | ........... H05K/3/46 |
| JP | 08-172274 | 7/1996 | ........... H05K/3/46 |

OTHER PUBLICATIONS

Amey, D., et al., "Advances in MCM Ceramics", *Solid State Technology*, 143–146, (1997).

Baniecki, J., et al., "Dielectric Relaxation of Ba0.7 Sr0.3 TiO3 Thin Films from 1 mHz to 20 GHz", *Appl. Phys. Letter* 72 (4), 1998 American Institute of Physics, 198–500, (Jan. 1998).

Chan, Y., et al., "Fabrication and Characterization of Multilayer Capacitors Buried in a Low Temperature Co–Fired Ceramic Substrate", *Active and Passive Elec. Comp.* vol. 20, 215–224, (1998).

Choi, K.L., et al., "Characterization of Embedded Passives Using Macromodels in LTCC Technology", *IEEE Transactions on Components, Packaging, and Manufacturing Technology*, vol. 21, 258–268, (Aug. 1998).

(List continued on next page.)

*Primary Examiner*—Dean A. Reichard
*Assistant Examiner*—Nguyen Ha
(74) *Attorney, Agent, or Firm*—Schwegman, Lundberg, Woessner & Kluth, P.A.

(57) ABSTRACT

To reduce switching noise, the power supply terminals of an integrated circuit die can be coupled to the respective terminals of at least one embedded capacitor in a multilayer ceramic substrate. In one embodiment, the capacitor is formed of at least one high permittivity layer. In another embodiment, several high permittivity layers are interleaved with conductive layers. Alternatively, the capacitor can comprise at least one embedded discrete capacitor. Also described are an electronic system, a data processing system, and various methods of manufacture.

37 Claims, 7 Drawing Sheets

U.S. PATENT DOCUMENTS

| | | | | |
|---|---|---|---|---|
| 5,870,289 | A | * | 2/1999 | Tokuda et al. ............... 361/779 |
| 5,929,510 | A | * | 7/1999 | Geller et al. ................. 257/635 |
| 5,939,782 | A | * | 8/1999 | Malladi ....................... 257/698 |
| 5,949,654 | A | | 9/1999 | Fukuoka ...................... 361/760 |
| 6,072,690 | A | * | 6/2000 | Farooq et al. ............ 361/321.2 |
| 6,075,427 | A | | 6/2000 | Tai et al. ..................... 333/219 |
| 6,104,599 | A | | 8/2000 | Ahiko et al. ............. 361/306.3 |
| 6,183,669 | B1 | * | 2/2001 | Kubota et al. ............ 252/518.1 |
| 6,218,729 | B1 | * | 4/2001 | Zavrel, Jr. et al. .......... 257/698 |
| 6,252,761 | B1 | | 6/2001 | Branchavsky ............ 361/321.2 |
| 6,452,776 | B1 | | 9/2002 | Chakravorty ............... 361/303 |

OTHER PUBLICATIONS

Eurskens, W., et al., "Design and Performance of UHF Band Inductors, Capacitors and Resonators Using LTCC Technology for Mobile Communication Systems", *1998 IEEE MTT–S Digest*, 1285–1288, (1998).

Koschmieder, T., et al., "Ceramic Substrate Thickness, Test Board Thickness, and Part Spacing: A Screening Doe", *Proceedings of SMTA International Conference*, 6 pgs., (Sep. 1999).

Mistler, R.E., "Tape Casting: Past, Present, Potential", *The American Ceramic Society Bulletin*, 82–86, (Oct. 1998).

Nishimura, T., et al., "3.5 V Operation Driver–Amplifier MMIC Utilizing SrTiO3 Capacitors for 1.95 GHz Wide–Band CDMA Cellular Phones", *1998 IEEE MTT–S Digest*, 447–450, (1998).

Rector, Jr., J., et al., "Integrated and Integral Passive Components: A Technology Roadmap", *1997 Electronic Componenets and Technology Conference*, 713–723, (1997).

Scrantom, S., et al., "Manufacture of Embedded Integrated Passive Components into Low Temperature Co–Fired Ceramic Systems", *1998 International Symposium on Microelectronics*, 459–466, (1998).

Sugai, K., et al., "Multilayer Alumina Substrates for ECU", *1998 IEEE/CPMT Berlin Int'l Electronics Manufacturing Technology Symposium*, 109–112, (1998).

Tok, A.I., et al., "Tape Casting of Composite Ceramic Substrates Using Hollow Micro–Speherical Powders", *Processing and Fabrication of Advanced Materials VII*, Proceedings of a Symposium organized by: The Minerals, Metals & Materials Society (TMS), Warrendale, PA, USA, 451–461, (Oct. 1998).

Ueda, T., et al., "GaAs MMIC Chip–sets for Mobile Communication Systems with On–chip Ferroelectric Capacitors", *Integrated Ferroelectrics*, vol. 7, 45–60, (1995).

Williamson, III, W., et al., "High Frequency Dielectric Properties of PLZT Thin Films", *Integrated Ferroelectrics*, vol. 17, 197–203, (1997).

Yamasaki, K., et al., "Solder Column Interposer Grid Array—Improved CBGA Reliability", 1–9.

Yao, K., et al., "Improved Preparation Procedure and Properties for a Multilayer Piezoelectric Thick–Film Actuator", *Sensors and Actuators A 71*, 139–143, (1998).

* cited by examiner

ELECTRONIC ASSEMBLY COMPRISING SUBSTRATE WITH EMBEDDED CAPACITORS

RELATED INVENTION

Ser. No. 09/628,705, entitled "Electronic Assembly Comprising Interposer with Embedded Capacitors and Methods of Manufacture".

TECHNICAL FIELD OF THE INVENTION

The present invention relates generally to electronics packaging. More particularly, the present invention relates to an electronic assembly that includes a substrate having one or more embedded capacitors to reduce switching noise in a high speed integrated circuit, and to manufacturing methods related thereto.

BACKGROUND OF THE INVENTION

Integrated circuits (ICs) are typically assembled into packages by physically and electrically coupling them to a substrate made of organic or ceramic material. One or more such IC packages can be physically and electrically coupled to a printed circuit board (PCB) or card to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates, where each new generation of packaging must provide increased performance while generally being smaller or more compact in size.

An IC substrate may comprise a number of insulated metal layers selectively patterned to provide metal interconnect lines (referred to herein as "traces"), and one or more electronic components mounted on one or more surfaces of the substrate. The electronic component or components are functionally connected to other elements of an electronic system through a hierarchy of conductive paths that includes the substrate traces. The substrate traces typically carry signals that are transmitted between the electronic components, such as ICs, of the system. Some ICs have a relatively large number of input/output (I/O) terminals, as well as a large number of power and ground terminals. The large number of I/O, power, and ground terminals requires that the substrate contain a relatively large number of traces. Some substrates require multiple layers of traces to accommodate all of the system interconnections.

Traces located within different layers are typically connected electrically by vias (also called "plated throughholes") formed in the board. A via can be made by making a hole through some or all layers of a substrate and then plating the interior hole surface or filling the hole with an electrically conductive material, such as copper or tungsten.

One of the conventional methods for mounting an IC on a substrate is called "controlled collapse chip connect" (C4).

In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity.

As the internal circuitry of ICs, such as processors, operates at higher and higher clock frequencies, and as ICs operate at higher and higher power levels, switching noise can increase to unacceptable levels.

For the reasons stated above, and for other reasons stated below which will become apparent to those skilled in the art upon reading and understanding the present specification, there is a significant need in the art for a method and apparatus for packaging an IC on a substrate that minimizes problems, such as switching noise, associated with high clock frequencies and high power delivery.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides a solution to power delivery problems that are associated with prior art packaging of integrated circuits that operate at high clock speeds and high power levels by embedding one or more decoupling capacitors in a multilayer substrate. Various embodiments are illustrated and described herein. In one embodiment, the IC die is directly mounted to the multilayer substrate, which contains embedded capacitors. The embedded capacitors can be discrete capacitors, or they can be one or more layers of capacitive material.

Figure 1:
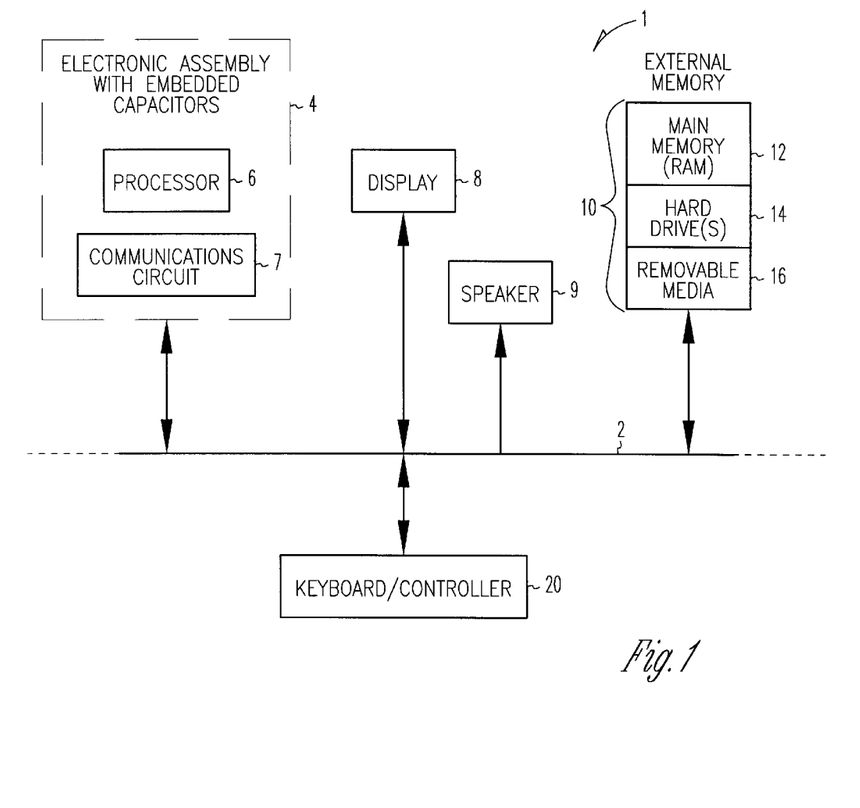
FIG. 1 is a block diagram of an electronic system incorporating at least one electronic assembly with embedded capacitors in accordance with one embodiment of the invention.

FIG. 1 is a block diagram of an electronic system 1 incorporating at least one electronic assembly 4 with embedded capacitors in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a loudspeaker 9, and a keyboard and/or controller 20, which can include a mouse, trackball, game controller, voice-recognition device, or any other device that permits a system user to input information into and/or receive information from electronic system 1.

Figure 2:
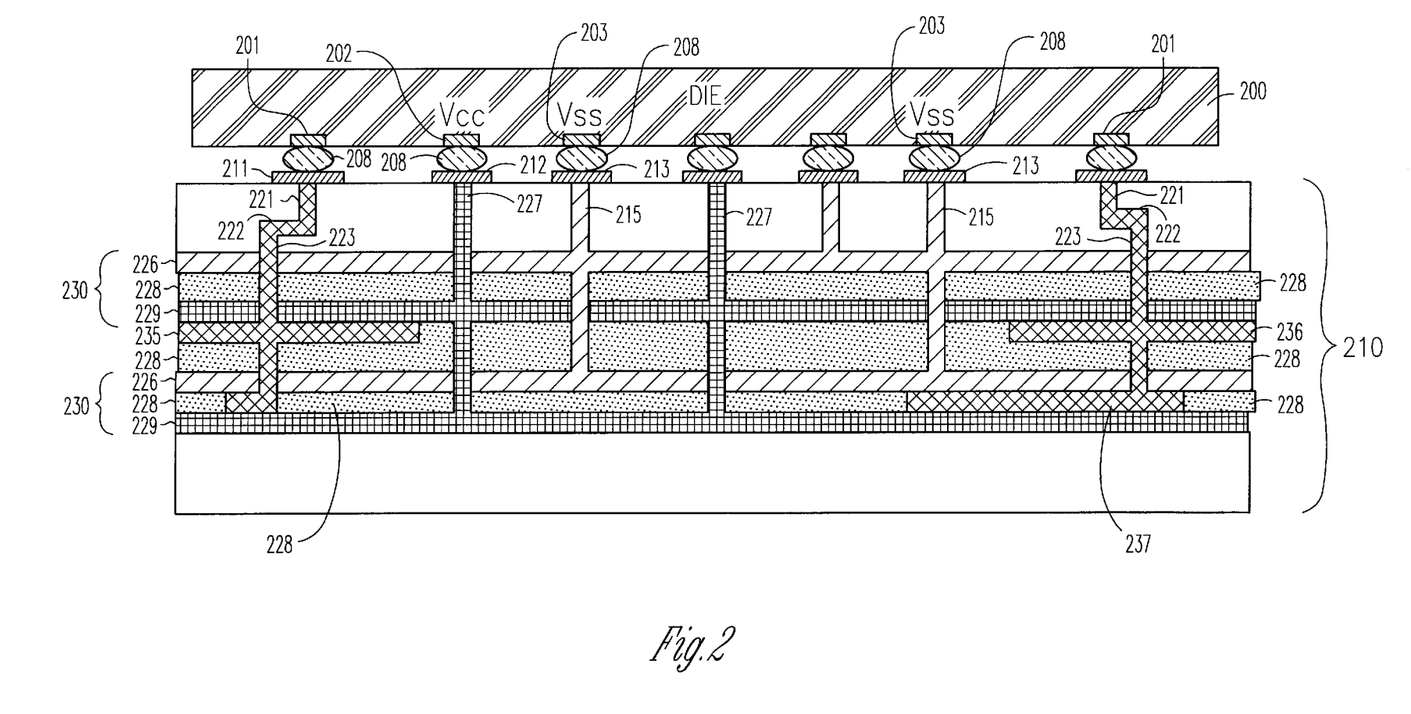
FIG. 2 shows a cross-sectional representation of a multilayer substrate with embedded capacitors in accordance with one embodiment of the invention.

FIG. 2 shows a cross-sectional representation of a multilayer substrate 210 with embedded capacitors in accordance with one embodiment of the invention. Substrate 210 has a plurality of lands 211–213 on one surface thereof that can be coupled to leads or conductive areas 201–203, respectively, on IC die 200 via solder balls or bumps 208. Leads 201 are coupled to signal lines of IC die 200, lead 202 is coupled to Vcc, and lead 203 is coupled to Vss. It will be understood that, although identical reference numbers have been used for the two conductive paths carrying signal levels, i.e. the paths comprising the structure identified by reference numbers 201, 208, 211, and 221–223, these signals can be different. Signal path structure can include various signal conductors illustrated as conductive layers within ceramic substrate 210, such as signal conductors 235–237.

Signal leads or bumps, such as signal bumps 201, are typically arranged at the periphery of the die in an arrangement that is, for example, several rows deep (only one row being shown on each side of die 200 for the sake of simplicity).

Substrate 210 can include multiple Vcc, Vss, and signal conductors, only, few of which are illustrated for the sake of simplicity.

Substrate 210 comprises a pair of embedded capacitors. Each capacitor 230 comprises a pair of capacitive plates 226 and 229, with high permittivity (Dk) layers 228 between the capacitive plates 226 and 229, and between capacitors 230. One capacitive plate 226 of each capacitor 230 can be coupled to a Vss terminal 203 on die 200 via conductor 215, land 213, and solder ball 208. Another capacitive plate 229 of each capacitor 230 can be coupled to a Vcc terminal 202 on die 200 via conductor 227, land 212, and solder ball 208.

The expression "high permittivity layer" as used herein means a layer of high permittivity material such as a high permittivity ceramic ply such as titanate particles; a high permittivity dielectric film such as a titanate film that is deposited, for example, by Sol-Gel or metal-organic chemical vapor deposition (MOCVD) techniques; or a layer of any other type of high permittivity material.

Substrate 210 can be provided with one or more embedded capacitors 230.

Die 200 and substrate 210 can be of any type. In one embodiment, die 200 is a processor, and substrate 210 is a multilayer ceramic substrate.

In the embodiment shown in FIG. 2, metallized power vias 215 and 227, situated in the central or core region of substrate 210, can connect the Vss and Vcc capacitive plates 226 and 229, respectively, of capacitor 230 to the corresponding regions of the die, which can comprise a relatively large number of Vss die bumps 203 (to couple to a corresponding number of Vss lands 213) and Vcc die bumps 202 (to couple to a corresponding number of Vcc lands 212), distributed in the core region of the die 200. This large parallel connectivity ensures very low inductance (e.g. <1 pico-Henry) and enhances the current carrying ability of the overall IC packaging structure.

The invention is equally applicable to embodiments where signal traces occur other than at the periphery of the die, and to embodiments where Vcc and Vss traces are provided anywhere on the die.

It will be understood that while the pitch of power vias 215 and 227 in FIG. 2 is shown to be the same as the die bump pitch, the pitch of power vias 215 and 227 could be different from that of the die bump pitch. Likewise, while the pitch of signal vias 223 is shown to be wider than that of the die bump pitch, it could be the same in another embodiment. The geometry of the vias, including via pitch, can be varied in any suitable manner in accordance with design parameters known to those skilled in the art.

Various embodiments can be implemented using ceramic substrate technology.

One important purpose of the substrate with embedded capacitor(s) is to provide relatively high capacitance relatively close to the die in order to reduce the effect of reactive inductive coupling when the IC is operating, particularly at high clock speeds.

Figure 3:
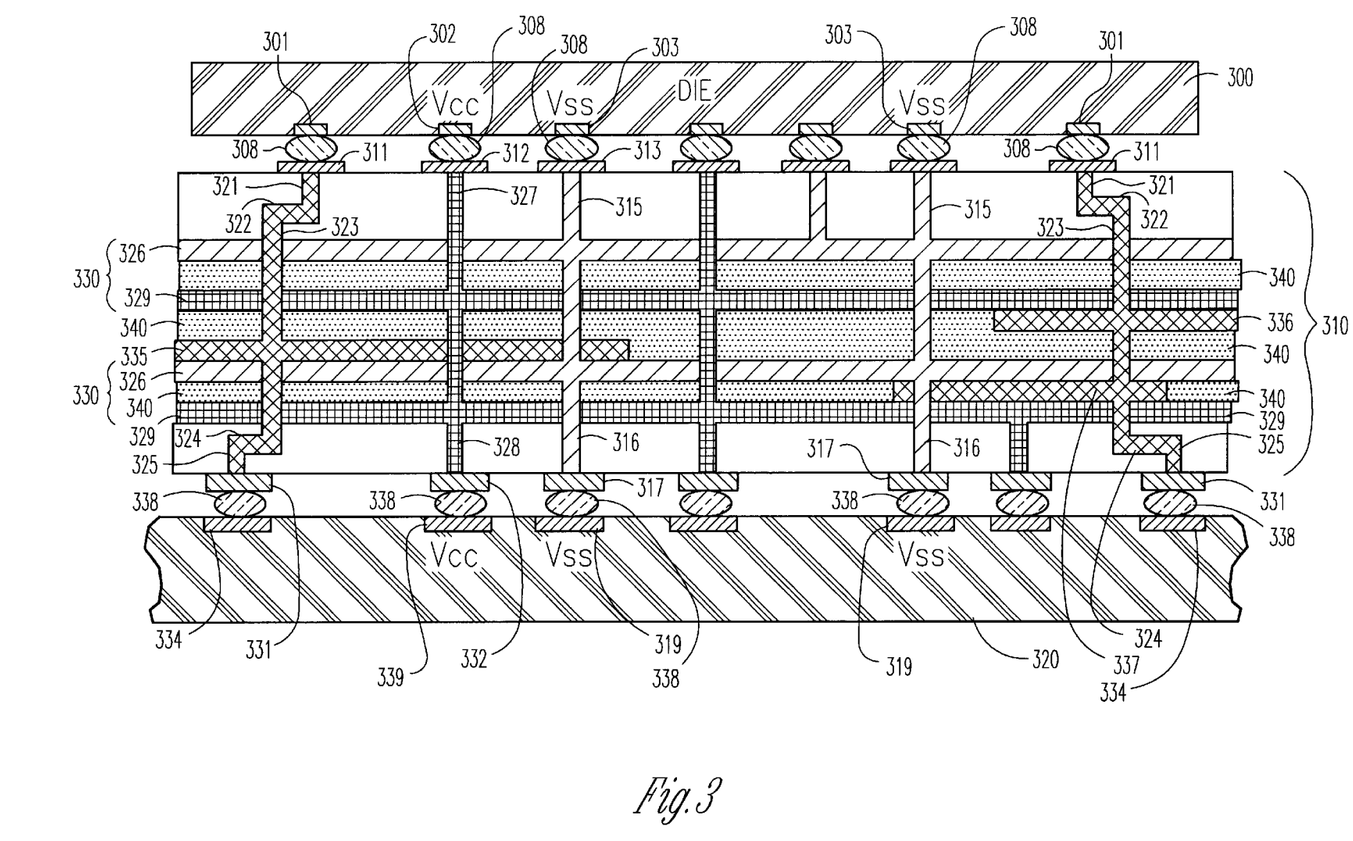
FIG. 3 shows a cross-sectional representation of a multilayer substrate with embedded capacitors in accordance with another embodiment of the invention.

FIG. 3 shows a cross-sectional representation of a substrate 310 with embedded capacitors in accordance with another embodiment of the invention. In the embodiment illustrated in FIG. 3, substrate 310 can be coupled to a further substrate 320. Substrate 320 can be similar to substrate 310, optionally having an IC die (not shown) on the opposite surface thereof, or it can be a printed circuit board (PCB) or other type of substrate. Leads or conductive areas 334, 339, and 319 of substrate 320 can be coupled to corresponding lands 331, 332, and 317 of substrate 310 via solder balls 338.

The internal structure of substrate 310 can be similar to that described above regarding substrate 210 (FIG. 2). Thus, substrate 310 has a plurality of lands 311–313 on one surface thereof that can be coupled to leads or conductive areas 301–303, respectively, on IC die 300 via solder balls 308. Leads 301 are coupled to signal lines of IC die 300, lead 302 is coupled to Vcc, and lead 303 is coupled to Vss. It will be understood that, although identical reference numbers have been used for the two conductive paths carrying signal levels, i.e. the paths comprising the structure identified by reference numbers 301, 308, 311, and 321–323, these signals can be different. Signal path structure can include various signal conductors illustrated as conductive layers within substrate 310, such as signal conductors 335–337.

Substrate 310 can include multiple Vcc, Vss, and signal conductors, only a few of which are illustrated for the sake of simplicity.

Substrate 310 can comprise a pair of embedded capacitors 330, each comprising a pair of capacitive plates 326 and 329, with high Dk layers 340 between the capacitive plates 326 and 329, and between capacitors 330. One capacitive plate 326 of each capacitor 330 can be coupled to a Vss terminal 303 on die 300 through via segment 315, land 313, and solder ball 308. Plate 326 can also be coupled to a Vss terminal 319 on substrate 320 by means of via segment 316, land 317, and solder ball 338. Another capacitive plate 329 of each capacitor 330 can be coupled to a Vcc terminal 302 on die 300 through via segment 327, land 312, and solder ball 308. Plate 329 can also be coupled to a Vcc terminal 339 on substrate 320 by means of via segment 328, land 332, and solder ball 338.

Substrate 310 can be provided with one or more embedded capacitors 330.

Die 300 and substrates 310 and 320 can be of any type. In one embodiment, die 300 is a processor, substrate 310 is a multilayer ceramic substrate, and substrate 320 is a PCB. In another embodiment, substrate 320 is a ceramic substrate.

In the embodiment shown in FIG. 3, metallized power vias 315, 316 (it should be noted that various via segments illustrated in FIGS. 2 and 3, such as via segments 315, 316 and 327, 328, can be either separate vias or one continuous via) and 327, 328, situated in the central or core region of substrate 310, can connect the Vss and Vcc capacitive plates 326 and 329, respectively, of capacitor 330 to the corresponding regions of the die, which can comprise a relatively large number of Vss die bumps 303 (to couple to a corresponding number of Vss lands 313) and Vcc die bumps 302 (to couple to a corresponding number of Vcc lands 312), distributed at the core regions of the die 300. This large parallel connectivity ensures very low inductance (e.g. <1 pico-Henry).

Various embodiments of substrates 310 and 320 can be implemented using ceramic substrate technology. The structure, including types of materials used, dimensions, number of layers, layout of power and signal conductors, and so forth, of substrates 310 and 320 can be similar or different, depending upon the requirements of the electronic assembly of which they form a part.

It will be understood that the land/bump pitch of the top of substrate 310 needs to match the bump pitch of die 300, and that the land/bump pitch of the bottom of substrate 310 needs to match the pad pitch of substrate 320. While in the embodiment shown in FIG. 3 the pitch of the power vias 315 and 327 is the same on the top and bottom of substrate 320, and the pitch of the signal vias 323 is wider on the bottom of substrate 320 than on the top of substrate 320, the pitch relationship could be altered in any suitable fashion to satisfy design constraints and objectives.

Figure 4:
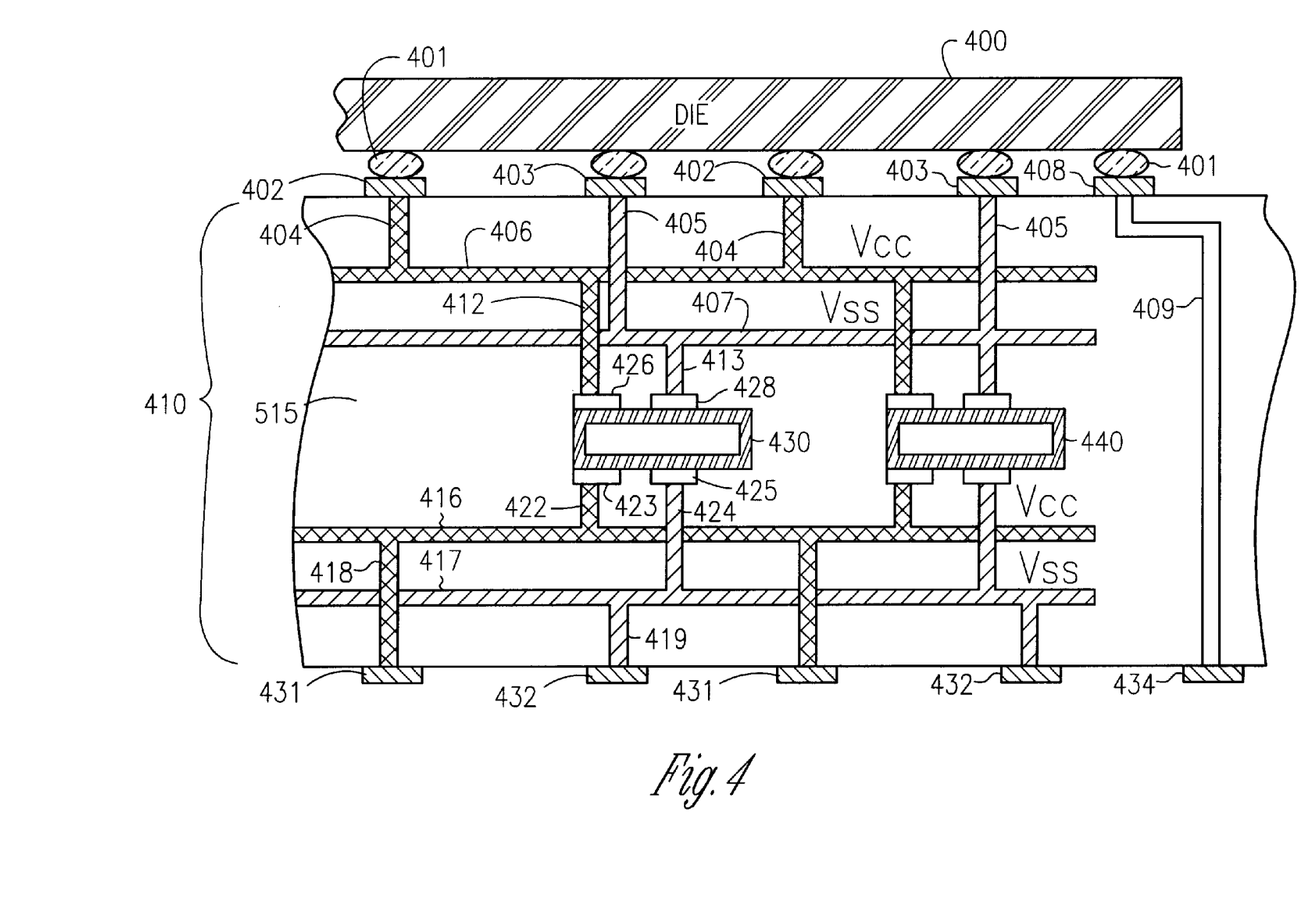
FIG. 4 shows a cross-sectional representation of a multilayer substrate with embedded discrete capacitors in accordance with an alternate embodiment of the invention.

FIG. 4 shows a cross-sectional representation of a multilayer substrate 410 with two embedded discrete capacitors 430 and 440 in accordance with an alternate embodiment of the invention. Substrate 410, which can include multiple layers of Vcc, Vss, and signal conductors, is intended to be used to mount a die 400 thereon. Lands 402 of substrate 410 are intended to be at Vcc potential and can be coupled via certain ones of solder balls 401 to corresponding conductive areas (not shown) on IC die 400. Likewise, lands 403 are intended to be at Vss potential and can be coupled via other solder balls 401 to corresponding areas (not shown) on IC die 400.

Discrete capacitors 430 and 440 can be of any suitable type. In one embodiment, each discrete capacitor 430 and 440 comprises a pair of upper terminals 426 and 428 and a pair of lower terminals 423 and 425. However, discrete capacitors with more or fewer terminals and/or with terminals coupled only to the upper portions of substrate 410 may also be used. For example, in the Related Invention mentioned above, in one embodiment a single discrete capacitor embedded within an interposer has two terminals that are coupled only to the upper part of the interposer. A similar capacitive structure could likewise be employed in an embodiment of the present invention, i.e. having terminals that are coupled only to the upper part of substrate 410.

Lands 402 are coupled to upper terminal 426 of embedded capacitor 430 by a route that includes power vias 404, conductive layer 406, and power via 412. Lands 403 are coupled to the other upper terminal 428 of embedded capacitor 430 by a route that includes power vias 405, conductive layer 407, and power via 413.

Lands 431 are coupled to lower terminal 423 of embedded capacitor 430 by a route that includes power vias 418, conductive layer 416, and power via 422. Lands 432 are coupled to the other lower terminal 425 of embedded capacitor 430 by a route that includes power vias 419, conductive layer 417, and power via 424.

As illustrated in FIG. 4, the power vias, including power vias 404, 405, 412, 413, 418, 419, 422, and 424, are located in a core region of substrate 410 (the left-hand portion of IC die 400 and substrate 410 are not illustrated for simplicity), which substantially underlies the core region of IC die 400.

Various signal routing (not illustrated for the sake of simplicity, but comprising signal areas of IC die 400, certain solder balls 401, appropriate lands on substrate 410 such as lands 408 and 434, and signal planes and signal vias within substrate 410 such as signal via 409) can also be provided within substrate 410, as will be understood by those of ordinary skill.

As illustrated in FIG. 4, the signal vias, including signal via 409, are located in a peripheral region of substrate 410 (the left-hand portion of IC die 400 and substrate 410 are not illustrated for simplicity), which substantially underlies the periphery of IC die 400.

Embedded capacitors 430 and 440 can be of any suitable construction. In one embodiment, they are ceramic chip capacitors that are fabricated using conventional ceramic chip capacitor technology. While two capacitors 430 and 440 are illustrated, for the sake of simplicity of illustration and description, a different number of capacitors could be used in the embodiment illustrated in FIG. 4, including only one capacitor.

FIGS. 2–4 are merely representational and are not drawn to scale. Certain proportions thereof may be exaggerated, while others may be minimized. FIGS. 2–4 are intended to illustrate various implementations of the invention, which can be understood and appropriately carried out by those of ordinary skill in the art.

Fabrication

Multilayer ceramic substrates can be fabricated by conventional techniques, such as but not limited to high temperature co-fired ceramic (HTCC) technology, high thermal coefficient of expansion (HITCE) technology, or glass ceramic technology.

Although it is known in ceramic technology to embed low Dk capacitors in ceramic substrates, by sandwiching thin (e.g. 2 mils) films of conventional ceramic such as $Al_2O_3$ between metal planes, in the present invention multilayer stacks of high Dk ply are used in one embodiment. High Dk ply is commercially available for fabricating ceramic chip capacitors, for example. Suitable high Dk materials, such as titanate particles, can be inserted into the conventional ceramic matrix. Multilayer stacks of high Dk ply, such as $BaTiO_3$, in the present invention can provide capacitances as high as 10 $\mu$F/sq. cm., compared to capacitances in the range of only nano-Farads/sq. cm. for low Dk ply.

In an alternative embodiment, a high Dk layer, such as a titanate film, e.g. $(Ba_xSr_{1-x})TiO_3$ (BST) or $PbZrTiO_3$ (PZT) or $Ta_2O_5$ or $SrTiO_3$, can be formed in the ceramic substrate by known techniques such as a metal-organic chemical vapor deposition (MOCVD) process, or a Sol-Gel process, in which a sol, which is a colloidal suspension of solid particles in a liquid, transforms into a gel due to growth and interconnection of the solid particles.

In either case, high Dk material can be embedded at temperature ranges that are compatible with ceramic technology (e.g. 600–1000 degrees Centigrade).

Regarding the embodiment illustrated in FIG. 4, wherein discrete capacitors 430 and 440 are embedded in the substrate 410, access to capacitors 430 and 440 can be made by any conventional technique, such as punching or laser ablation, and the Vcc and Vss conductors of substrate 410 can be coupled to the terminals of capacitors 430 and 440 by any appropriate metallization technique that is consistent with the temperature requirements of the process.

Estimation of Capacitance

Capacitance values for the embodiment shown in FIG. 3 can be estimated via Equation 1.

$$C = A * \epsilon_r * \epsilon_0 / d \qquad \text{Equation (1)}$$

where:
A=capacitor size (square meters)
$\epsilon_r$=permittivity constant $8.854 \times 10^{-12}$ Farads/meter
$\epsilon_0$=dielectric constant of insulator
d=dielectric layer thickness (meters)

Figure 5:
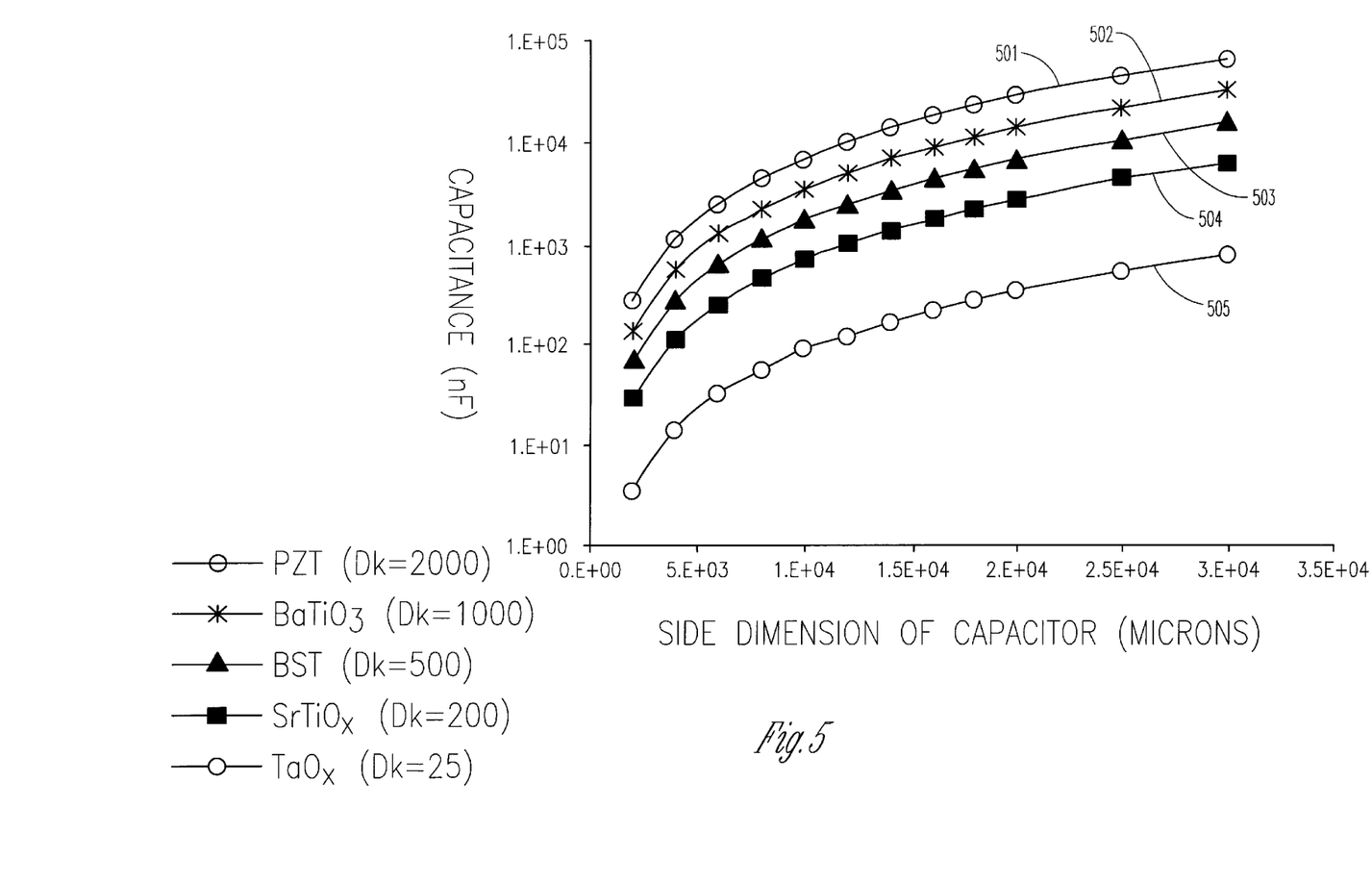
FIG. 5 shows a graphical representation of capacitance versus area for various dielectric materials that can be used in a substrate with an embedded capacitor in accordance with one embodiment of the invention.

FIG. 5 shows a graphical representation of capacitance (in nano-Farads) versus a side dimension of the capacitor (in microns) for various dielectric materials that can be used in a substrate with an embedded capacitor in accordance with one embodiment of the invention. Shown in FIG. 5 are plots for the following dielectric materials: line 501 for PZT (Dk=2000), line 502 for $BaTiO_3$ (Dk=1000), line 503 for BST (Dk=500), line 504 for $SrTiO_x$ (Dk=200), and line 505 for $TaO_x$ (Dk=25).

FIG. 5 summarizes the approximate range of capacitance available with the various titanates and oxide materials indicated. When using high permittivity ceramic ply (such as ceramic ply impregnated with $BaTiO_3$), the indicated values correspond to the maximum capacitance generally achievable with a 10 micron thick ply between Vcc and Vss layers in a stack containing 40 such layers.

In the case of dielectric formed by Sol-Gel or MOCVD embodiments (e.g., PZT, BST, $SrTiO_3$ or $Ta_2O_5$), the computed values correspond to a 0.25 micron film of the indicated dielectric.

To satisfy the capacitance requirements of any given embodiment, multiple layers of capacitors could be stacked as necessary.

Figure 6:
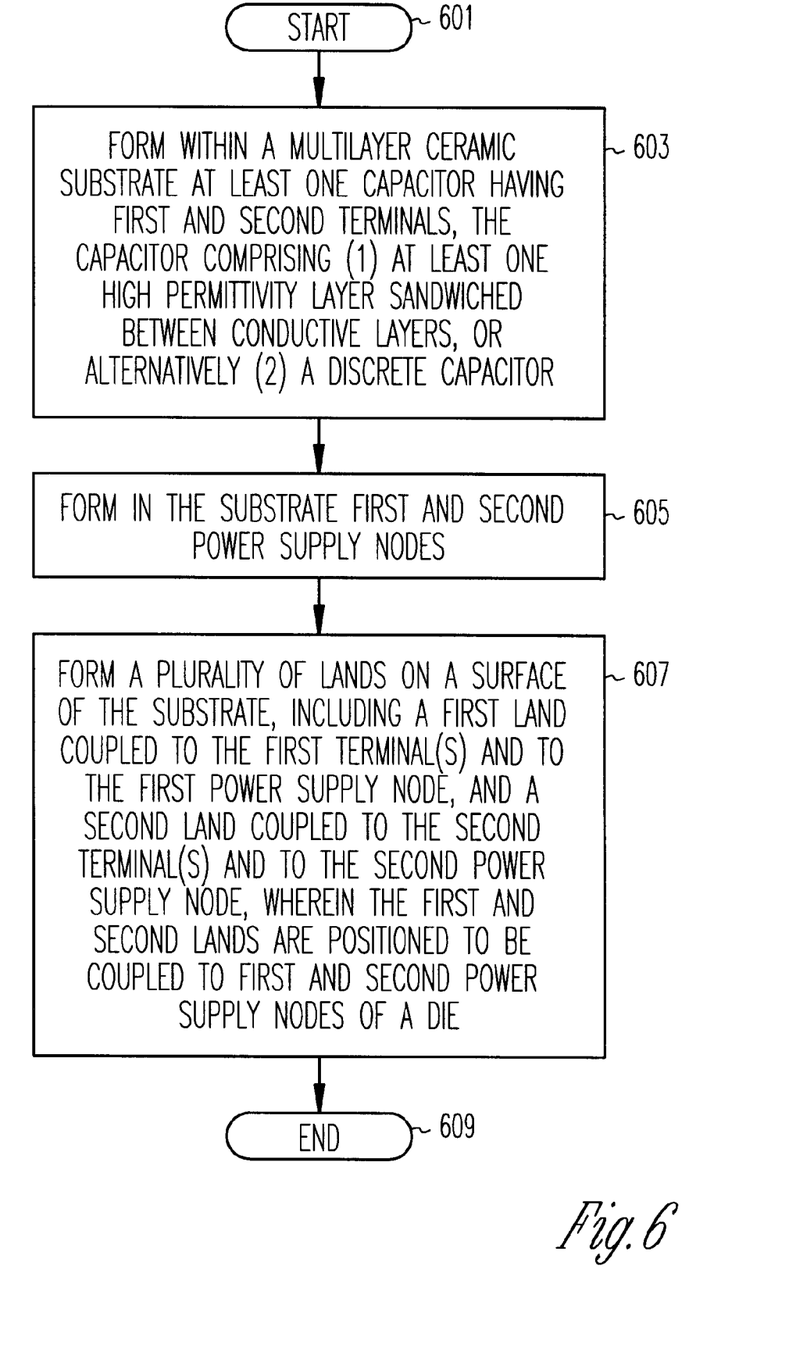
FIG. 6 is a flow diagram of a method of fabricating a substrate comprising an embedded capacitor, in accordance with one embodiment of the invention.

FIG. 6 is a flow diagram of a method of fabricating a substrate comprising an embedded capacitor, in accordance with one embodiment of the invention. The method begins at 601.

In 603, at least one capacitor having first and second terminals is formed within a substrate structure. In one embodiment, the structure is a multilayer ceramic structure, although in other embodiments the structure could be formed of a material other than a ceramic material. The capacitor comprises (1) at least one high permittivity layer sandwiched between conductive layers; alternatively, the capacitor is (2) a discrete capacitor.

In 605, first and second power supply nodes are formed in the substrate structure. As used herein, the term "power supply node" refers to either a ground node (e.g. Vss) or to a power node at a potential different from ground (e.g. Vcc).

In 607, a plurality of lands are formed on a surface of the substrate structure, including a first land coupled to the first terminal(s) of the capacitor(s) and to the first power supply node, and a second land coupled to the second terminal(s) of the capacitor(s) and to the second power supply node. The first and second lands are positioned to be coupled to first and second power supply nodes of a die (e.g. IC die 200, FIG. 2) that is to be juxtaposed to a surface of the substrate structure and physically affixed thereto. The method ends at 609.

Figure 7:
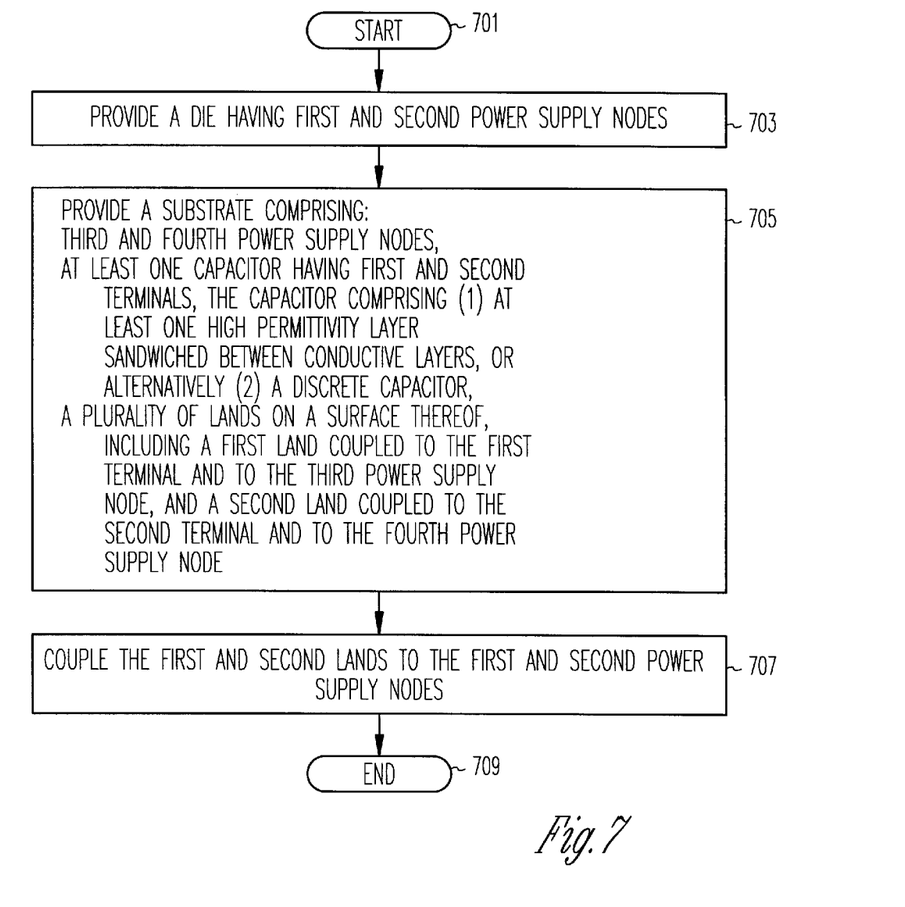
FIG. 7 is a flow diagram of a method of fabricating an electronic assembly having a substrate comprising an embedded capacitor, in accordance with one embodiment of the invention.

FIG. 7 is a flow diagram of a method of fabricating an electronic assembly having a substrate comprising an embedded capacitor, in accordance with one embodiment of the invention. The method begins at 701.

In 703, a die is provided that has first and second power supply nodes.

In 705, a substrate is provided that has third and fourth power supply nodes. The substrate comprises at least one capacitor having first and second terminals. The capacitor comprises (1) at least one high permittivity layer sandwiched between conductive layers; alternatively, the capacitor is a discrete capacitor. The substrate further comprises a plurality of lands on a surface thereof, including a first land coupled to the first terminal(s) of the capacitor(s) and to the third power supply node, and a second land coupled to the second terminal(s) of the capacitor(s) and to the fourth power supply node.

In 707, the first and second lands are coupled to the first and second power supply nodes, respectively, of the die. The method ends at 709.

The operations described above with respect to the methods illustrated in FIGS. 6 and 7 can be performed in a different order from those described herein.

Conclusion

The present invention provides for an electronic assembly and methods of manufacture thereof that minimize problems, such as switching noise, associated with high clock frequencies and high power delivery. The present invention provides scalable high capacitance (e.g. >10 mF/square centimeter) by employing embedded decoupling capacitors having low inductance which can satisfy the power delivery requirements of, for example, high performance processors. An electronic system that incorporates the present invention can operate at higher clock frequencies and is therefore more commercially attractive.

As shown herein, the present invention can be implemented in a number of different embodiments, including a substrate, an electronic assembly, an electronic system, a data processing system, a method for making a substrate, and a method for making an electronic assembly. Other embodiments will be readily apparent to those of ordinary skill in the art. The capacitive elements, choice of materials, geometries, and capacitances can all be varied to suit particular packaging requirements. The particular geometry of the embedded capacitors is very flexible in terms of their orientation, size, number, location, and composition of their constituent elements.

While embodiments have been shown in which signal traces are provided around the periphery, and in which Vcc and Vss traces are provided at the die core, the invention is equally applicable to embodiments where the signal traces occur other than at the periphery, and to embodiments where Vcc and Vss are provided anywhere on the die.

Further, the present invention is not to be construed as limited to use in C4 packages, and it can be used with any other type of IC package where the herein-described features of the present invention provide an advantage.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A multilayer ceramic substrate for mounting a die comprising:
   an embedded capacitor having first and second terminals;
   a first surface having a first core including a first plurality of power lands coupled to the first terminal and a first plurality of ground lands coupled to the second terminal, the first plurality of power lands and the first plurality of ground lands each being a relatively large number, and a first periphery comprising a first plurality of signal lands; and
   a second surface having a second core including a second plurality of power lands coupled to the first terminal and a second plurality of ground lands coupled to the second terminal, and a second periphery comprising a second plurality of signal lands;
   wherein the first plurality of power lands, the first plurality of ground lands, and the first plurality of signal lands are positioned to be coupled to corresponding power, ground, and signal nodes of the die.

2. The multilayer ceramic substrate recited in claim 1, wherein the second plurality of power lands, the second plurality of ground lands, and the second plurality of signal lands are positioned to be coupled to corresponding power, ground, and signal nodes of an additional substrate subjacent to the multilayer ceramic substrate.

3. The multilayer ceramic substrate recited in claim 1, wherein the embedded capacitor comprises at least one high permittivity layer.

4. The multilayer ceramic substrate recited in claim 1 wherein the embedded capacitor comprises a plurality of high permittivity layers.

5. The multilayer ceramic substrate recited in claim 4 wherein the embedded capacitor comprises a plurality of conductive layers interleaved with the high permittivity layers, such that alternating conductive layers are coupled to the first and second terminals , respectively.

6. The multilayer ceramic substrate recited in claim 1 wherein the embedded capacitor comprises at least one embedded discrete capacitor.

7. The multilayer ceramic substrate recited in claim 1 wherein at least one of the first plurality of power lands is coupled to the first terminal through a via that does not go entirely through the multilayer ceramic substrate.

8. The multilayer ceramin substrate recited in claim 1 wherein at least one of the second plurality of ground lands is coupled to the second terminal through a via that does not go entirely through the multilayer ceramic substrate.

9. An electronic assembly comprising:
   a die comprising power, ground, and signal nodes; and
   a multilayer ceramic substrate comprising:
      an embedded capacitor having first and second terminals;
      a first surface having a first core including a first plurality of power lands coupled to the first terminal and a first plurality of ground lands coupled to the second terminal, the first plurality of power lands and the first plurality of ground lands each being a relatively large number, and a first periphery comprising a first plurality of signal lands; and
      a second surface having a second core including a second plurality of power lands coupled to the first terminal and a second plurality of ground lands coupled to the second terminal, and a second periphery comprising a second plurality of signal lands;
      wherein the first plurality of power lands, the first plurality of ground lands, and the first plurality of signal lands are coupled to corresponding ones of the power, ground, and signal nodes of the die.

10. The electronic assembly recited in claim 9 wherein the embedded capacitor comprises at least one high permittivity layer.

11. The electronic assembly recited in claim 9 wherein the embedded capacitor comprises a plurality of high permittivity layers.

12. The electronic assembly recited in claim 11 wherein the embedded capacitor comprises a plurality of conductive layers interleaved with the high permittivity layers, such that alternating conductive layers are coupled to the first and second terminals , respectively.

13. The electronic assembly recited in claim 9 wherein the embedded capacitor comprises at least one embedded discrete capacitor.

14. The electronic assembly recited in claim 9 wherein at least one of the first plurality of power lands is coupled to the first terminal through a via that does not go entirely through the multilayer ceramic substrate.

15. The electronic assembly recited in claim 9 wherein at least one of the second plurality of ground lands is coupled to the second terminal through a via that does not go entirely through the multilayer ceramic substrate.

16. An electronic system comprising an electronic assembly having a die coupled to a
   multilayer ceramic substrate, the die comprising power, ground, and signal nodes, and the
   substrate including at least one embedded capacitor having first and second terminals; a first surface having a first core including a first plurality of power lands coupled to the first terminal and a first plurality of ground lands coupled to the second terminal, the first plurality of power lands and the first plurality of ground lands each being a relatively large number, and a first periphery comprising a first plurality of signal lands; and a second surface having a second core including a second plurality of power lands coupled to the first terminal and a second plurality of ground lands coupled to the second terminal, and a second periphery comprising a second plurality of signal lands;

wherein the first plurality of power lands, the first plurality of ground lands, and the first plurality of signal lands are coupled to corresponding power, ground, and signal nodes of the die.

17. The electronic system recited in claim 16 wherein the at least one embedded capacitor comprises at least one high permittivity layer.

18. The electronic system recited in claim 16 wherein the at least one embedded capacitor comprises a plurality of high permittivity layers.

19. The electronic system recited in claim 18 wherein the at least one embedded capacitor comprises a plurality of conductive layers interleaved with the high permittivity layers, such that alternating conductive layers are coupled to the first and second terminals, respectively.

20. The electronic system recited in claim 16 wherein the at least one embedded capacitor comprises at least one embedded discrete capacitor.

21. The electronic assembly recited in claim 16 wherein at least one of the first plurality of power lands is coupled to the first terminal through a via that does not go entirely through the multilayer ceramic substrate.

22. The electronic assembly recited in claim 16 wherein at least one of the second plurality of ground lands is coupled to the second terminal through a via that does not go entirely through the multilayer ceramic substrate.

23. A substrate to package a die comprising:

a plurality of power and ground vias in a core region of the substrate;

a plurality of signal vias in a peripheral region of the substrate;

an embedded capacitor having first and second terminals; and a surface having a plurality of power lands coupled to the first terminal through the plurality of power vias, a plurality of ground lands coupled to the second terminal through the plurality of ground vias, and a plurality of signal lands coupled to the plurality of signal vias;

wherein the plurality of power lands, the plurality of ground lands, and the plurality of signal lands are positioned to be coupled to corresponding power, ground, and signal nodes of the die through controlled collapse chip connect (C4) solder bumps, and wherein the plurality of power lands and the plurality of ground lands are each a relatively large number.

24. The substrate recited in claim 23, wherein the substrate is a multilayer ceramic substrate.

25. The substrate recited in claim 23, wherein at least one of the power vias does not go entirely through the substrate.

26. The substrate recited in claim 23, wherein at least one of the ground vias does not go entirely through the substrate.

27. A substrate to package a die comprising:

a plurality of power and ground vias in a core region of the substrate;

an embedded capacitor having first and second terminals;

a first surface including a first plurality of power lands coupled to the first terminal through first ones of the plurality of power vias, and a first plurality of ground lands coupled to the second terminal through first ones of the plurality of ground vias;

a second surface including a second plurality of power lands coupled to the first terminal through second ones of the plurality of power vias, and a second plurality of ground lands coupled to the second terminal through second ones of the plurality of ground vias;

wherein the first plurality of power lands and the first plurality of ground lands are positioned to be coupled to corresponding power and ground nodes of the die through controlled collapse chip connect (C4) solder bumps.

28. The substrate recited in claim 27, wherein the substrate is a multilayer ceramic substrate.

29. The substrate recited in claim 27, wherein the first plurality of power lands and the first plurality of ground lands are each a relatively large number.

30. The substrate recited in claim 27, wherein at least one of the power vias does not go entirely through the substrate.

31. The substrate recited in claim 27, wherein at least one of the ground vias does not go entirely through the substrate.

32. A substrate to package a die comprising:

a plurality of power and ground vias in a core region of the substrate;

a plurality of signal vias;

an embedded capacitor having first and second terminals;

a first surface including a first plurality of power lands coupled to the first terminal through first ones of the plurality of power vias, a first plurality of ground lands coupled to the second terminal through first ones of the plurality of ground vias, and a first plurality of signal lands coupled to the plurality of signal vias;

a second surface including a second plurality of power lands coupled to the first terminal through second ones of the plurality of power vias, a second plurality of ground lands coupled to the second terminal through second ones of the plurality of ground vias, and a second plurality of signal lands coupled to the plurality of signal vias;

wherein the first plurality of power lands, the first plurality of ground lands, and the first plurality of signal lands are positioned to be coupled to corresponding power, ground, and signal nodes of the die through controlled collapse chip connect (C4) solder bumps.

33. The substrate recited in claim 32, wherein the substrate is a multilayer ceramic substrate.

34. The substrate recited in claim 32, wherein the first plurality of power lands and the first plurality of ground lands are each a relatively large number.

35. The substrate recited in claim 32, wherein at least one of the power vias does not go entirely through the substrate.

36. The substrate recited in claim 32, wherein at least one of the ground vias does not go entirely through the substrate.

37. The substrate recited in claim 32, wherein the plurality of signal vias are in a peripheral region of the substrate.

* * * * *

UNITED STATES PATENT AND TRADEMARK OFFICE
CERTIFICATE OF CORRECTION

PATENT NO. : 6,611,419 B1
DATED : August 26, 2003
INVENTOR(S) : Kishore K. Chakravorty It is certified that error appears in the above-identified patent and that said Letters Patent is hereby corrected as shown below:

Column 9,
Line 65, delete "," after "1".

Column 10,
Lines 63-67, delete the preamble and insert the following:
-- An electronic system comprising an electronic assembly having a die coupled to a multilayer ceramic substrate, the die comprising power, ground, and signal nodes, and the substrate including: --

Column 11,
Lines 1-8, delete the following:
"at least one embedded capacitor having first and second terminals; a first surface having a first core including a first plurality of power lands coupled to the first terminal and a first plurality of ground lands coupled to the second terminal, the first plurality of power lands and the first plurality of ground lands each being a relatively large number, and a first periphery comprising a first plurality of signal lands; and" and insert
-- at least one embedded capacitor having first and second terminals;
a first surface having a first core including a first plurality of power lands coupled to the first terminal and first plurality of ground lands coupled to the second terminal, the first plurality of power lands and the first plurality of ground lands each being a relatively large number, and a first periphery comprising a first plurality of signal lands; and --
Lines 33 and 37, delete "assembly" and insert -- system -- therefor.

Signed and Sealed this

Thirty-first Day of August, 2004

JON W. DUDAS
*Director of the United States Patent and Trademark Office*